United States Patent
Chen et al.

(10) Patent No.: US 9,638,740 B2
(45) Date of Patent: May 2, 2017

(54) TEST SYSTEM WITH ROTATIONAL TEST ARMS FOR TESTING SEMICONDUCTOR COMPONENTS

(71) Applicant: CHROMA ATE INC., Taoyuan County (TW)

(72) Inventors: Chien-Ming Chen, Taoyuan County (TW); Herbert Tsai, Taoyuan County (TW); Chin-Yi Ou Yang, Taoyuan County (TW)

(73) Assignee: CHROMA ATE INC., Taoyuan County (TW)

(*) Notice: Subject to any disclaimer, the term of this patent is extended or adjusted under 35 U.S.C. 154(b) by 724 days.

(21) Appl. No.: 14/048,785

(22) Filed: Oct. 8, 2013

(65) Prior Publication Data

US 2014/0103954 A1    Apr. 17, 2014

(30) Foreign Application Priority Data

Oct. 11, 2012 (TW) .............................. 101137524 A

(51) Int. Cl.
*G01R 31/26* (2014.01)
*G01R 31/28* (2006.01)

(52) U.S. Cl.
CPC ..... *G01R 31/2601* (2013.01); *G01R 31/2887* (2013.01); *G01R 31/2893* (2013.01)

(58) Field of Classification Search
CPC ............ G01R 31/2642; G01R 31/2887; G01R 31/2601; G01R 31/2893
USPC ....................................................... 324/757.01
See application file for complete search history.

(56) References Cited

U.S. PATENT DOCUMENTS

| 5,617,945 A * | 4/1997 | Takahashi ................ G01R 1/02 198/471.1 |
| 2008/0007285 A1* | 1/2008 | Nakase .............. G01R 31/2893 324/750.03 |

* cited by examiner

*Primary Examiner* — Melissa Koval
*Assistant Examiner* — Courtney McDonnough
(74) *Attorney, Agent, or Firm* — Locke Lord LLP; Tim Tingkang Xia, Esq.

(57) ABSTRACT

A test system with rotational test arms for testing semiconductor components includes a transport device, a first test socket, a second test socket, a first test arm, and a second test arm. The first test socket and the second test socket are electrically connected to different test signals respectively and correspond to the first test arm and the second test arm. The first test arm and the second test arm test arms operate rotationally to carry and place the semiconductor components to the transport device, the first test socket and the second test socket, so the test time is improved.

19 Claims, 5 Drawing Sheets

TEST SYSTEM WITH ROTATIONAL TEST ARMS FOR TESTING SEMICONDUCTOR COMPONENTS

The current application claims a foreign priority to the patent application of Taiwan No. 101137524 filed on Oct. 11, 2012.

BACKGROUND OF THE INVENTION

1. Field of the Invention

The present invention relates to a test system with rotational test arms for testing semiconductor components; in particular, the present invention relates to a test system testing semiconductor components by test arms moving the semiconductor components rotationally to two test sockets.

2. Description of Related Art

The production of integrated circuit (IC) generally includes IC design and wafer manufacture of the initial period, wafer electrical test of the middle period, final test of the last period, and delivery of goods. For the requirement of minimizing the semiconductor devices, every stage of the IC manufacturing process plays the same important role. Among them, the electrical test can check every electrical parameter of the semiconductor components to ensure that the product works properly; the reality test utilizes the test system equipment to simulate the work environment of the different product on the public-board by loading different test program or with different customized test equipment, for checking if the semiconductor component can perform the required specifications.

Currently semiconductor tester has many innovative designs on the rear test stage. For example, automatic system function tester (ASFT) can provide several sets of PCB level parallel test for production, compatible to the different package types of QFP, TQFP, µBGA, PGA, and CSP, through the design of multi-bit test ports, multiple transport devices and other mechanisms, for increasing the throughput of production test.

Furthermore, if the different test signals are performed in the same test socket, the test socket requires a complex circuit and program design, and the test time for each device under test (DUT) is long. The test time corresponds to the cost, and the cost of every DUT is calculated in units of test time, so every manufacturer wants to make effort to save test time and design better test process. However, the most direct way is the adoption of a simple and high production machine.

Please refer to FIG. 1, showing a block diagram of a tester for DUT according to the prior art. The tester is illustrated by two test sites, and each test site has a transport device, a test arm, a test socket, and a test board. The first test site 11 has the first transport device 111, the first test arm 112, the first test socket 113, and the first test board 1131. The second test site 12 has the second transport device 121, the second test arm 122, the second test socket 123, and the second test board 1231.

The test process is illustrated by the first test site 11 for example. The transport device 111 carries the DUT to the first test socket 113; then the first test arm 112 moves down and presses the DUT to start testing. The test time is determined by the test program, and each of the test sites is the same. After completing the test, the DUT is carried from the first test site 113 to the transport device 111 for classifying. Therefore, for four test sites, the tester requires four test arms and at least one moving arm for classifying; even if the test arm can move the DUT and replace the moving arm, the driving mechanism of the test arms will become complex.

According to mentioned above, some testers in the testing process repeatedly moving and caused a lot of wasted time waiting. If the moving time can be saved while retaining the flexibility of the machine, and consider optimizing the testing process according to the DUT, the throughput of testing semiconductor components will be improved.

SUMMARY OF THE INVENTION

A primary object and feature of the present invention is to provide a test system with rotational test arms for testing semiconductor components overcoming the above-mentioned problem(s).

An embodiment of the invention provides a test system with rotational test arms for testing semiconductor components located in a test area of the test system by electrically connecting a plurality of test signals. The test system comprises a transport device, a first test socket, a second test socket, a first test arm, and a second test arm. The transport device has a plurality of load sockets for loading the semiconductor components. The first test socket is located in the test area; the first test socket is electrically connected to one of the test signals. The second test socket is located in the test area and close to the first test socket; the second test socket is electrically connected to one of the test signals. The first test arm carries the semiconductor components to the transport device, the first test socket, and the second test socket. The second test arm carries the semiconductor components to the transport device, the first test socket, and the second test socket.

Other features of the present invention will be apparent from the accompanying drawings and from the detailed description which follows.

DETAILED DESCRIPTION OF THE PREFERRED EMBODIMENTS

The aforementioned and other technical contents, aspects and effects in relation with the present invention can be clearly acknowledged through the detailed descriptions concerning the preferred embodiments of the present invention in conjunction with the appended drawings.

Figure 1:
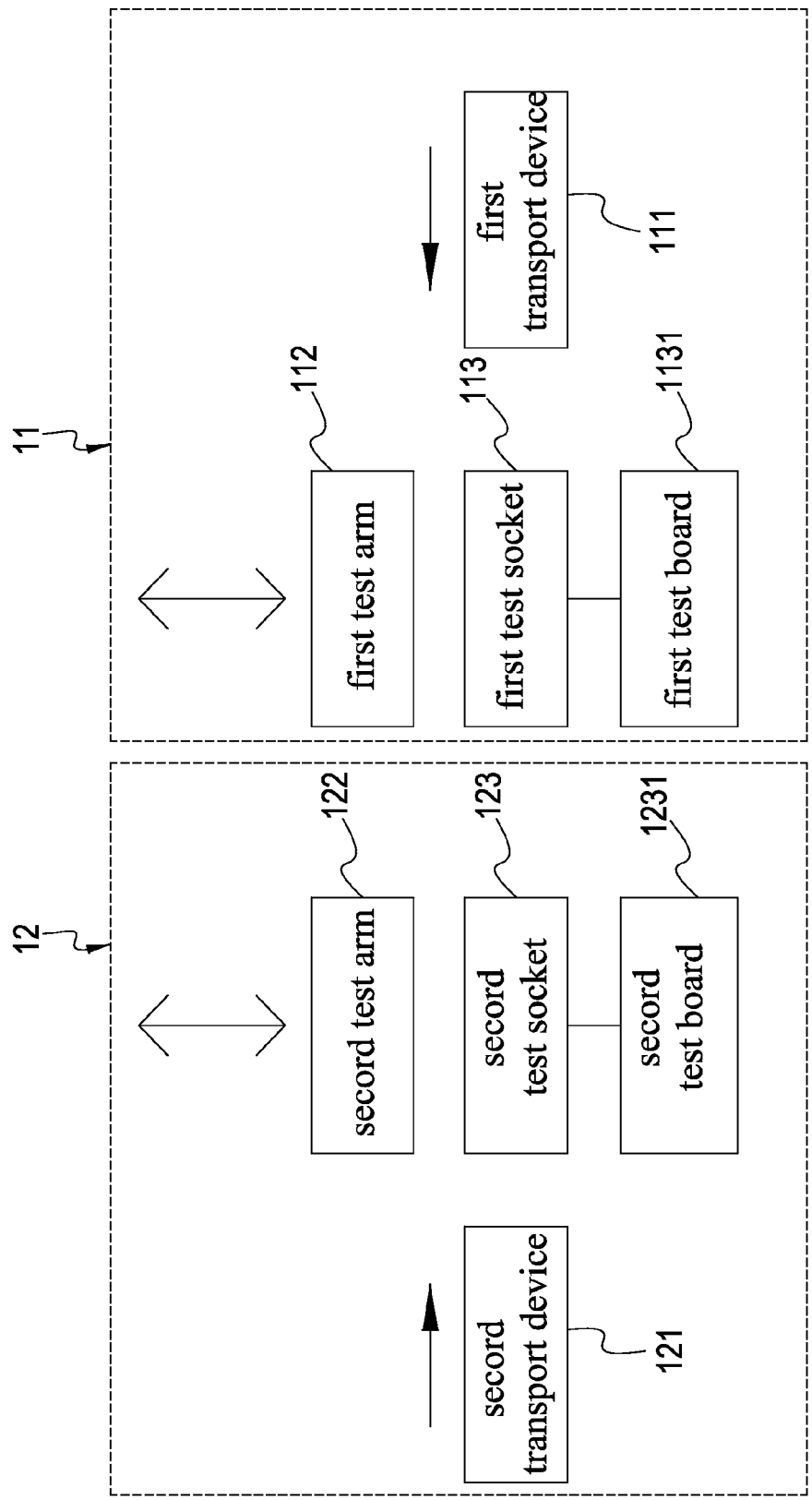
FIG. 1 shows a block diagram of a tester for semiconductor components according to the prior art.
Figure 2:
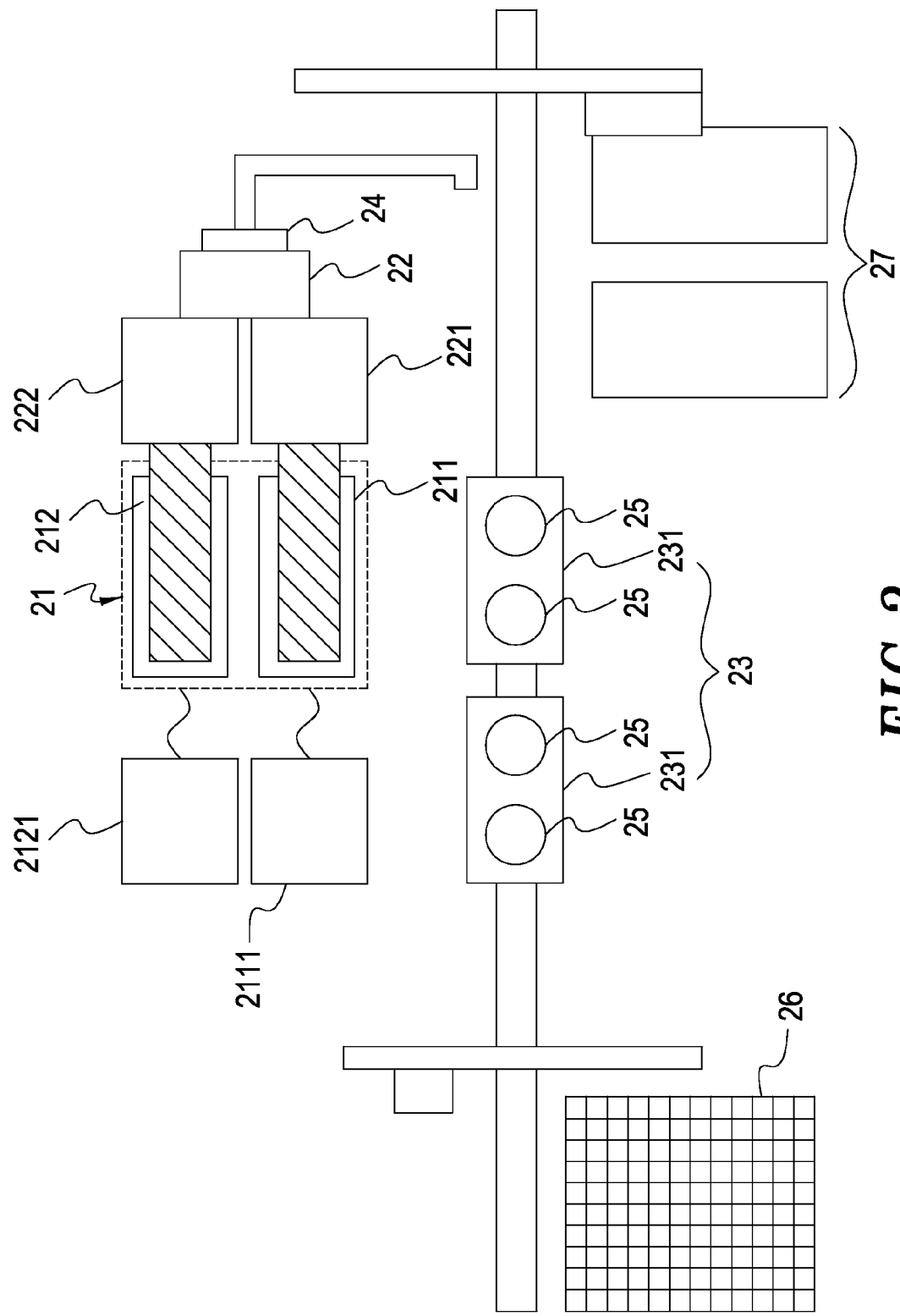
FIG. 2 shows a schematic view of a test system with rotational test arms for testing semiconductor components according to the present invention.

Please refer to FIG. 2, showing a test system with rotational test arms for testing semiconductor components and illustrating rotational operations of the test arms according to the present invention. The semiconductor components under test receive different test signals from the independent test signal generators respectively. The independent test signal generators are electrically connected to the test area 21 of the test system for testing the semiconductor components. The test area 21 and the transport device 23 locate between the input area 26 and the classifying area 27. The test area 21 has the first test socket 211 and the second test socket 212. The transport device 23 carries the semiconductor components under test to the input area 26 and classifying area 27.

The first test socket 211 provides the first test site electrically connected to one of the test signal generators, and the second test socket 212 provides the second test site electrically connected to one of the test signal generators. In this embodiment, the first test site is electrically connected to the first test signal generator 2111, and the second test site is electrically connected to the second test signal generator 2121. The first test site and the second test site load the semiconductor components under test, and the first test site and the second test site can load single or a plurality of semiconductor components.

The moving path of the first test arm 221 and the second test arm 222 includes the first test socket 211, the second test socket 212, and the transport device 23, for carrying and placing the semiconductor components 25 under test. The rotational test arms 22 have the first test arm 221 and the second test arm 222. When the rotational test arms 22 operate, the first test arm 221 and the second test arm 222 move rotationally for carrying and placing the semiconductor components 25. The rotational test arms 22 can be implemented by different driving operations; for example, the test arms can be driven by gears, belts, or motors.

The second test socket 212 is located close to the first test socket 211, and the first test socket 211 is located close to the transport device 23 which has the plurality of load sockets 231. When the rotational test arms 22 are driven by the YZ-coordinate mechanism 24 and move to the position between the transport device 23 and the first test socket 211 or the second test socket 212, the rotational test arms 22 can move the semiconductor components 25 under test to the load socket, the first test socket, and the second test socket.

Figure 3:
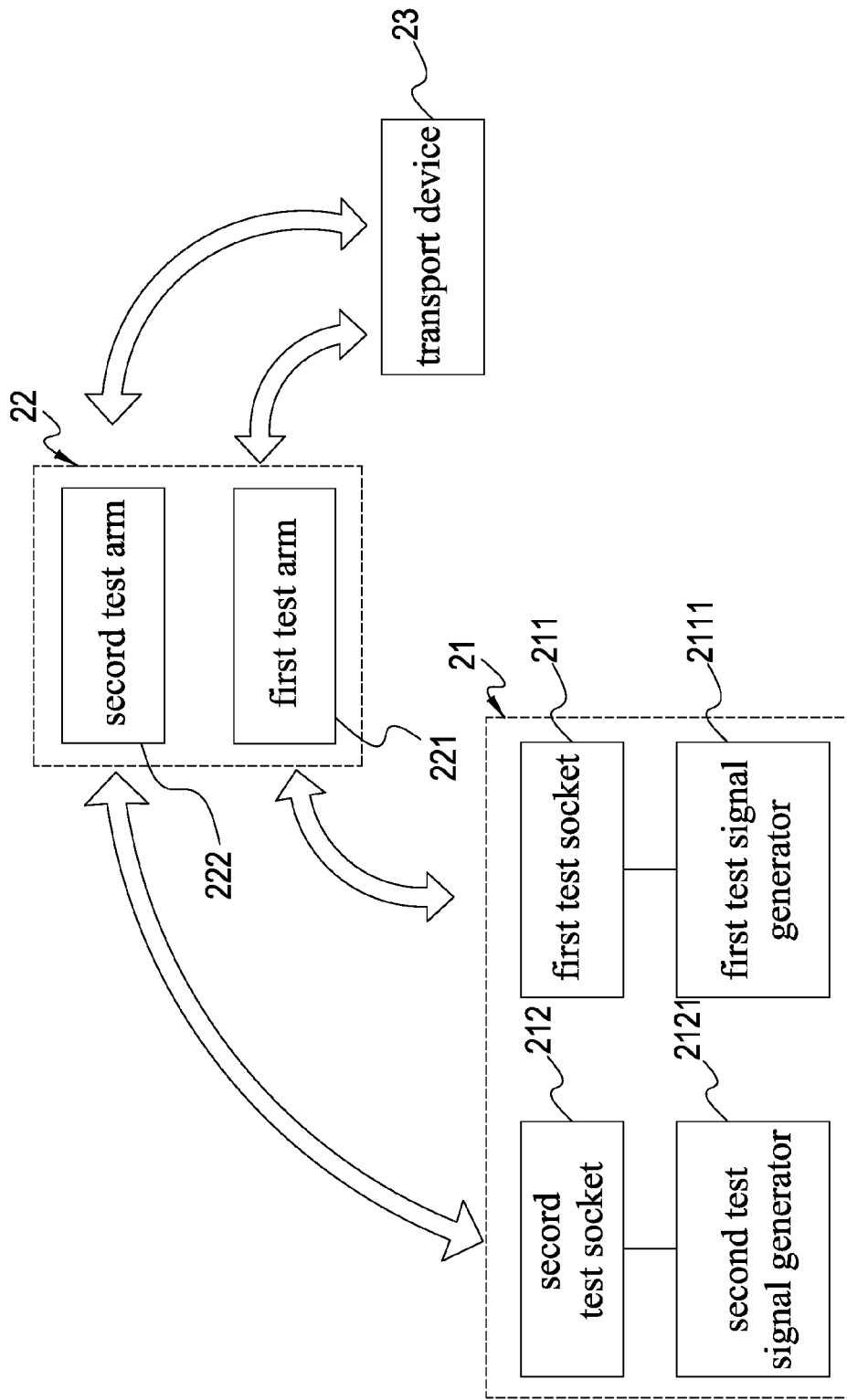
FIG. 3 shows an operation diagram of a test system with rotational test arms for testing semiconductor components according to the present invention.
Figure 4:
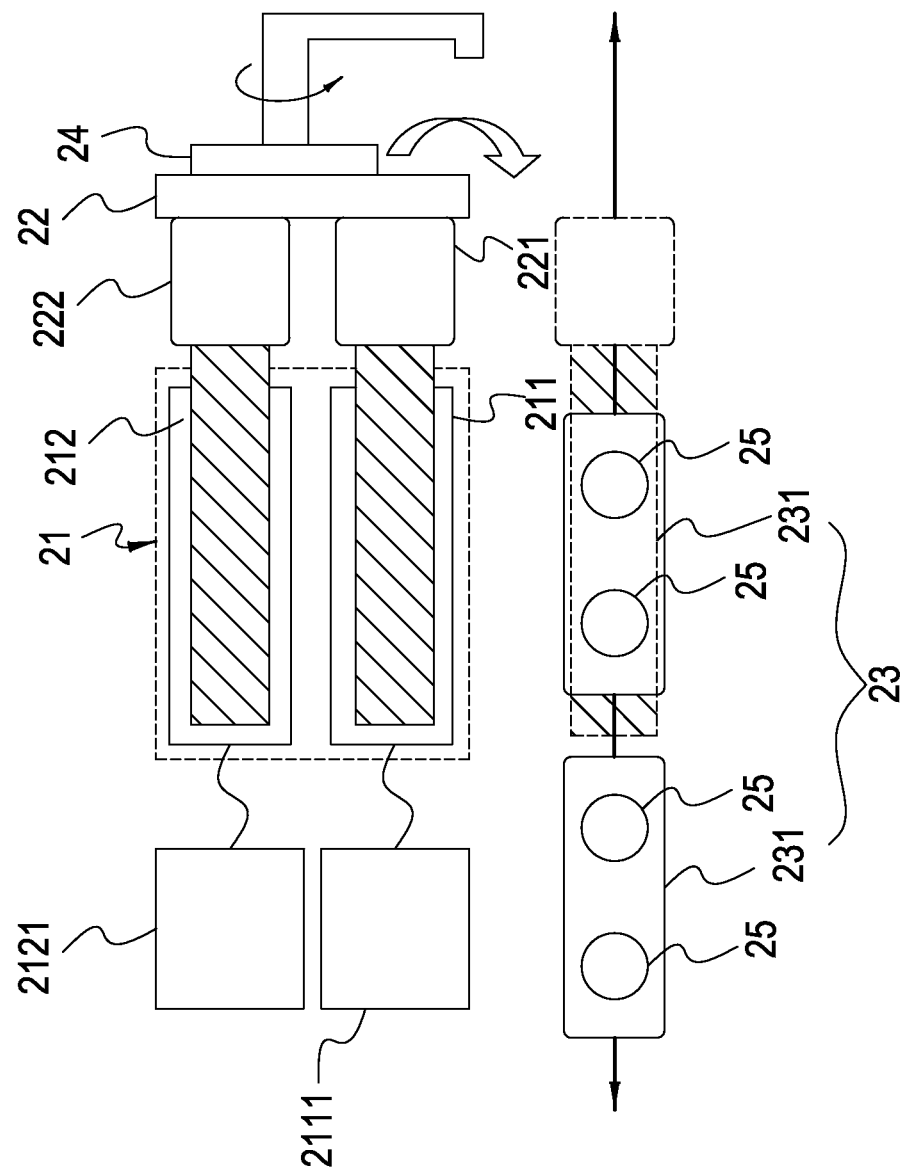
FIG. 4 shows the first embodiment of the test system with rotational test arms for testing semiconductor components according to the present invention.

Please refer to FIG. 3 and FIG. 4. According to the first embodiment, if each of semiconductor components 25 requires only single test signal depended on test items of the semiconductor components 25, the first test socket 211 and the second test socket 212 are electrically connected to two identical test signal generators respectively, or received the test signals respectively outputted from the same generator. The first test arm 221 moves between the transport device 23 and the first test socket 211, and the second test arm 222 moves between the transport device 23 and the second test socket 212, so the test arms operate for the corresponding test sockets when the first test socket 211 and the second test socket 212 provide the same test signals. The first test arm 221 moves to the upper position of the load socket 231 and then carries the semiconductor component 25 from the load socket 231 to the first test site of the first test socket 211. After completing the test, the first test arm 221 moves and carries the semiconductor component 25 to load socket 231. The first test arm 221 and the second test arm 222 operate alternatively according to the predetermined time difference. The operation of the second test arm 222 and the second test socket 212 is similar to the first test arm 221 and the first test socket 211.

Figure 5:
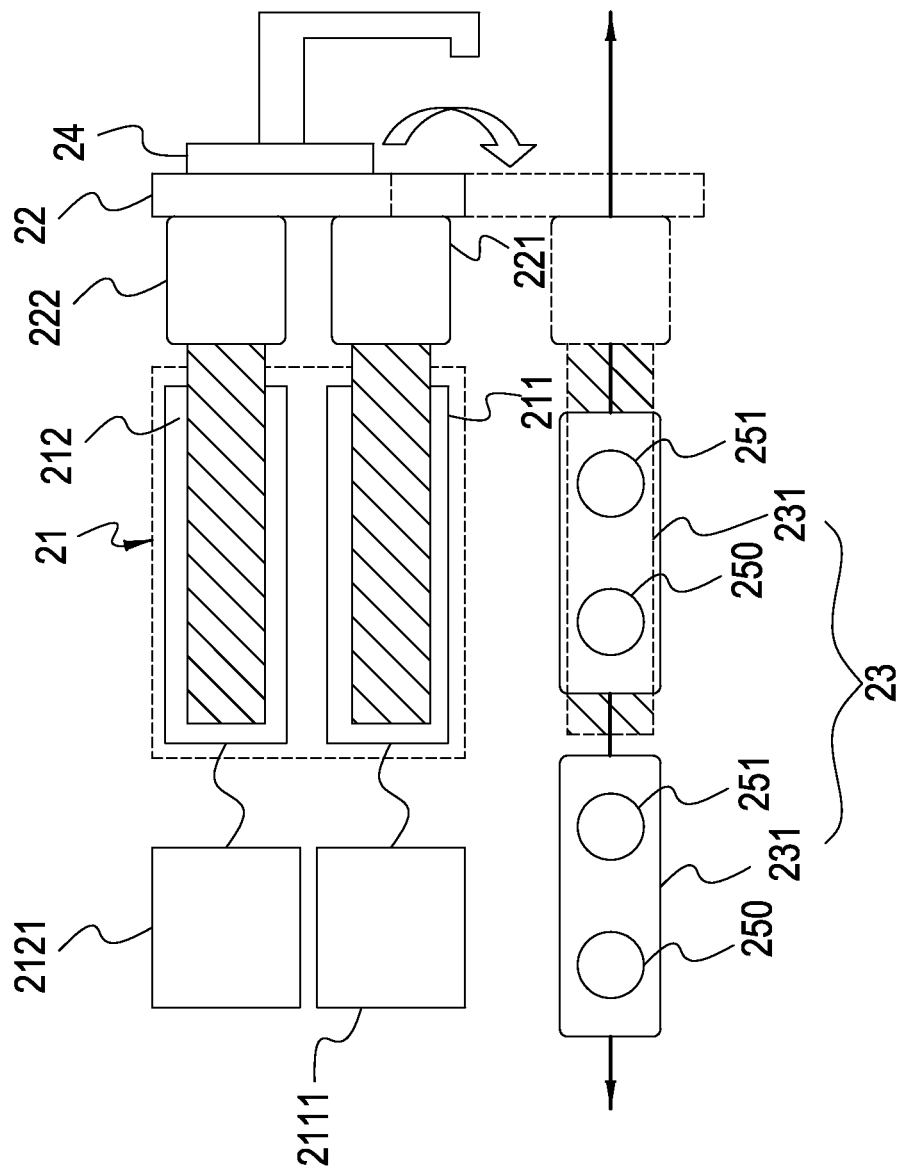
FIG. 5 shows the second embodiment of the test system with rotational test arms for testing semiconductor components according to the present invention.

Please refer to FIG. 5. According to the second embodiment, if each of semiconductor components 25 requires two different test signals depended on test items of the semiconductor components 25, the first test socket 211 and the second test socket 212 are electrically connected to two different test signal generators respectively. In the following, the semiconductor components 25 will be divided into the first semiconductor component 250 and the second semiconductor component 251 for further illustration.

When the first test socket 211 and the second test socket 212 perform the different test items, the first test arm 221 carries the first semiconductor component 250 from the load socket 231 and then places on the first test site of the first test socket 211; in the meanwhile, the second test arm 222 is ready or moves to the upper position of the load socket 231 and then carries the second semiconductor component 251. The first semiconductor component 250 will stay on the first test socket 211 in a while, for example, a few seconds, depended on configures of the first test signal generator 2111. After completing the test on the first test socket 211, the first test arm 221 carries the first semiconductor component 250 to the second test socket 212 in a short time, for receiving the test signal from the second test signal generator 2121; in the meanwhile, the second test arm 222 carries the second semiconductor component 251 from the load socket 231 to the first site of the first test socket 211 in a short time. Therefore, the first semiconductor component 250 and the second semiconductor component 251 are performed the test on the first test socket 211 and the second test socket 212 respectively at the moment.

After completing the above test, the first test arm 221 carries the first semiconductor component 250 from the second test socket 212 to the load socket 231, and then the second test arm 222 carries the second semiconductor component 251 from the first test socket 211 to the second test socket 212 in a short time. After the first test arm 221 placing the first semiconductor component 250, another load socket moves to the lower position of the first test arm 221 for changing a new semiconductor component 25 under test; then, the first test arm 221 carries the new semiconductor component 25 to the first test socket 211 for the test of the first test signal generator 2121. In this way, the first test arm 221 and the second test arm 222 operate rotationally for performing the test.

The distance from the load socket 231 to the second test socket 212 is longer than to the first test socket 211; that is, the test arms 22 require more time for moving, so the second test signal generator 2121 can be configured for the test time approximate to the sum of the moving time from the second test socket 212 to the load socket 231 and the test time of the first test signal generator 2111.

The production rate of the test system according to the present invention can be approximately calculated by the following formula:

$$\text{Max.UPH} = (3600/(B+C))*N$$

Where B is cycle time of the test arms; C is index time of the test process; N is number of the semiconductor components under test.

For example, the cycle time (B) of the test arms is 1.9 seconds; the index time (C) of the test process is 0.5 seconds; the number (N) of the semiconductor components under test is 4; the production of units per hour (3600 seconds) is calculated as UPH=(3600/(1.9+0.5))*4=6000 (Max).

Accordingly, the test system of the present invention can operate more efficient than the prior art; the test system of the present invention can complete more tests in the same length of time. In comparison to the prior art, the test system with rotational test arms for testing semiconductor components of the present invention provides the following features:

1. The test system comprises at least one transport device having a plurality of load sockets, and a plurality of test sockets; each of the test sockets is electrically connected to a different test signal respectively and corresponds to the rotational test arms; the test arms operate rotationally to carry and place the semiconductor components to the test sockets, so the test time is improved.

2. The test arms operate rotationally so each of the test arms can correspond to the different test socket for receiving the different test signal.

3. The test arms operate rotationally so each of the test arms can correspond to the different test socket for receiving the same test signal.

Through the aforementioned detailed descriptions for the preferred embodiments according to the present invention, it is intended to better illustrate the characteristics and spirit of the present invention rather than restricting the scope of the present invention to the preferred embodiments disclosed in the previous texts. On the contrary, the objective is to encompass all changes and effectively equivalent arrangements within the scope of the present invention as delineated in the following claims of the present application.

What is claimed is:

1. A test system with rotational test arms, for testing semiconductor components located in a test area of the test system by electrically connecting a plurality of test signals, the test system comprising:
    a transport device, having a plurality of load sockets for loading the semiconductor components;
    a first test socket, located in the test area, the first test socket electrically connected to one of the test signals;
    a second test socket, located in the test area and close to the first test socket, the second test socket electrically connected to one of the test signals;
    a first test arm, for carrying the semiconductor components to the transport device, the first test socket, and the second test socket; and
    a second test arm, for carrying the semiconductor components to the transport device, the first test socket, and the second test socket,
    wherein when the first test socket and the second test socket are respectively connected to different test signals,
        a first distance of the first test arm carrying at least one of the semiconductor components from the second test socket to one of the load sockets is greater than a second distance of the second test arm carrying at least another one of the semiconductor components from the first test socket to the second test socket, and
        a first time of the first test arm carrying at least one of the semiconductor components from the second test socket to one of the load sockets is substantially identical to a second time of the second test arm carrying at least another one of the semiconductor components from the first test socket to the second test socket.

2. The test system according to claim 1, wherein the first test socket and the second test socket are electrically connected to independent test signal generators respectively.

3. The test system according to claim 1, wherein the first test arm and the second test arm move rotationally to the transport device, the first test socket, and the second test socket, for changing the semiconductor components under test in the first test socket, the second test socket, and one of the load sockets.

4. The test system according to claim 2, wherein the first test arm and the second test arm move rotationally to the transport device, the first test socket, and the second test socket, for changing the semiconductor components under test in the first test socket, and the second test socket, and one of the load sockets.

5. The test system according to claim 1, further comprising a set of YZ-coordinate mechanism for driving the first test arm and the second test arm, so that the first test arm and the second test arm can move in Y-coordinate and carry the semiconductor components under test to the first test socket, and the second test socket, and one of the load sockets.

6. The test system according to claim 1, further comprising an input area and a classifying area for loading the semiconductor components, the input area and the classifying area located respectively on two ends for the transport device.

7. The test system according to claim 1, wherein when the first test arm carries at least one of the semiconductor components from the first test socket to the second test socket, the second test arm carries at least another one of the semiconductor components from one of the load sockets to the first test socket.

8. A test system with rotational test arms, for testing semiconductor components located in a test area of the test system by electrically connecting a plurality of test signals, the test system comprising:
    a transport device, having a plurality of load sockets for loading the semiconductor components;
    a first test socket, located in the test area, the first test socket electrically connected to one of the test signals;
    a second test socket, located in the test area and close to the first test socket, the second test socket electrically connected to one of the test signals;
    a first test arm, for carrying the semiconductor components to the transport device, the first test socket, and the second test socket; and
    a second test arm, for carrying the semiconductor components to the transport device, the first test socket, and the second test socket,
    wherein when the first test socket and the second test socket are respectively connected to different test signals,
        a first distance of the first test arm carrying at least one of the semiconductor components from the second test socket to one of the load sockets is greater than a second distance of the second test arm carrying at least another one of the semiconductor components from the first test socket to the second test socket, and
        a first time of the first test arm carrying at least one of the semiconductor components from the first test socket to the second test socket is substantially identical to a second time of the second test arm carrying at least another one of the semiconductor components from one of the load sockets to the first test socket.

9. The test system according to claim 8, wherein the first test socket and the second test socket are electrically connected to independent test signal generators respectively.

10. The test system according to claim 8, wherein the first test arm and the second test arm move rotationally to the transport device, the first test socket, and the second test socket, for changing the semiconductor components under test in the first test socket, the second test socket, and one of the load sockets.

11. The test system according to claim 9, wherein the first test arm and the second test arm move rotationally to the transport device, the first test socket, and the second test socket, for changing the semiconductor components under test in the first test socket, the second test socket, and one of the load sockets.

12. The test system according to claim 8, further comprising a set of YZ-coordinate mechanism for driving the first test arm and the second test arm, so that the first test arm and the second test arm can move in Y-coordinate and carry the semiconductor components under test to the first test socket, the second test socket, and one of the load sockets.

13. The test system according to claim 8, further comprising an input area and a classifying area for loading the semiconductor components, the input area and the classifying area located respectively on two ends for the transport device.

14. The test system according to claim 8, wherein when the first test arm carries at least one of the semiconductor components from the second test socket to one of the load sockets, the second test arm carries at least another one of the semiconductor components from the first test socket to the second test socket.

15. A test system with rotational test arms, for testing semiconductor components located in a test area of the test system by electrically connecting a plurality of test signals, the test system comprising:
- a transport device, having a plurality of load sockets for loading the semiconductor components;
- a first test socket, located in the test area, the first test socket electrically connected to one of the test signals;
- a second test socket, located in the test area and close to the first test socket, the second test socket electrically connected to one of the test signals;
- a first test arm, for carrying the semiconductor components to the transport device, the first test socket, and the second test socket; and
- a second test arm, for carrying the semiconductor components to the transport device, the first test socket, and the second test socket,
- wherein when the first test socket and the second test socket are respectively connected to different test signals, a first testing time of the second test socket testing at least one of the semiconductor components is approximate to a sum of a second testing time of the first test socket testing at least one of the testing semiconductor components and a time of at least one of the testing semiconductor components being carried by one of the first and second test arms from the first test socket to the second test socket.

16. The test system according to claim 15, wherein the first test socket and the second test socket are electrically connected to independent test signal generators respectively.

17. The test system according to claim 15, wherein when the first test socket and the second test socket are respectively connected to different test signals, a first distance of the first test arm carrying at least one of the semiconductor components from the second test socket to one of the load sockets is larger than a second distance of the second test arm carrying at least another one of the semiconductor components from the first test socket to the second test socket.

18. The test system according to claim 17, wherein a first time of the first test arm carrying at least one of semiconductor components from the first test socket to the second test socket is the same as a second time of the second test arm carrying at least another one of semiconductor components from one of the load sockets to the first test socket.

19. The test system according to claim 17, wherein a first time of the first test arm carrying at least one of the semiconductor components from the second test socket to one of the load sockets is the same as a second time of the second test arm carrying at least another one of the semiconductor components from the first test socket to the second test socket.

* * * * *